US008598900B2

United States Patent
Xu et al.

(10) Patent No.: US 8,598,900 B2
(45) Date of Patent: Dec. 3, 2013

(54) SYSTEM AND METHOD FOR TESTING ELECTRONIC DEVICE

(75) Inventors: Xia Xu, Wuhan (CN); Wen-Ming Yi, Wuhan (CN); Yu-Lin Liu, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/572,774

(22) Filed: Aug. 13, 2012

(65) Prior Publication Data

US 2013/0156064 A1    Jun. 20, 2013

(30) Foreign Application Priority Data

Dec. 20, 2011    (CN) .......................... 2011 1 0429467

(51) Int. Cl.
*G01R 31/3187* (2006.01)
(52) U.S. Cl.
USPC ............... 324/750.3; 324/750.06; 324/757.02
(58) Field of Classification Search
USPC .......................................... 324/750.6, 757.02
See application file for complete search history.

(56) References Cited

U.S. PATENT DOCUMENTS

| | | | | |
|---|---|---|---|---|
| 6,031,370 A * | 2/2000 | Kataoka | .................... | 324/762.01 |
| 6,807,504 B2 * | 10/2004 | Chen et al. | .................... | 702/118 |
| 7,301,359 B2 * | 11/2007 | Furukawa | ................ | 324/750.03 |
| 7,574,318 B2 * | 8/2009 | Hsieh | ............................ | 702/108 |
| 7,859,288 B2 * | 12/2010 | Furukawa | ................ | 324/762.02 |
| 2008/0302783 A1 * | 12/2008 | Wong et al. | .................... | 219/494 |
| 2009/0289654 A1 * | 11/2009 | Sheng et al. | .................. | 324/765 |
| 2012/0049873 A1 * | 3/2012 | Bourstein | ................ | 324/750.01 |

* cited by examiner

*Primary Examiner* — Richard Isla Rodas
(74) *Attorney, Agent, or Firm* — Altis & Wispro Law Group, Inc.

(57) ABSTRACT

A system for testing electronic device includes an electronic device, a temperature detecting module, a testing instrument and a testing computer. The testing electronic includes a main board and a power supply. The main board includes a slot and a card inserted in the slot. A plurality of dummy loads is located on the card. The slot includes at least one voltage interface. The power supply includes at least one power wire electrically connected to the at least one voltage interface. The temperature detecting module detects temperature signals of the plurality of dummy loads. The testing instrument is electrically connected to the at least one power wire to test current signals or power signals of the at least one power wire. The testing computer receives and displays the temperature signals, the current signals and the power signals.

10 Claims, 3 Drawing Sheets

SYSTEM AND METHOD FOR TESTING ELECTRONIC DEVICE

BACKGROUND

1. Technical Field

The present disclosure relates to a system and method for testing electronic device.

2. Description of Related Art

Electronic devices, such as desktop computers, notebook computers, digital photo frames, cellular phones, for example, usually require a test before being placed on the market. Heat dissipation systems of the electronic devices should be tested after the electronic devices are produced. A typical method for testing the electronic devices is using a testing card to detect the temperature in the electronic devices, which has a low precision.

Therefore there is a need for improvement in the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
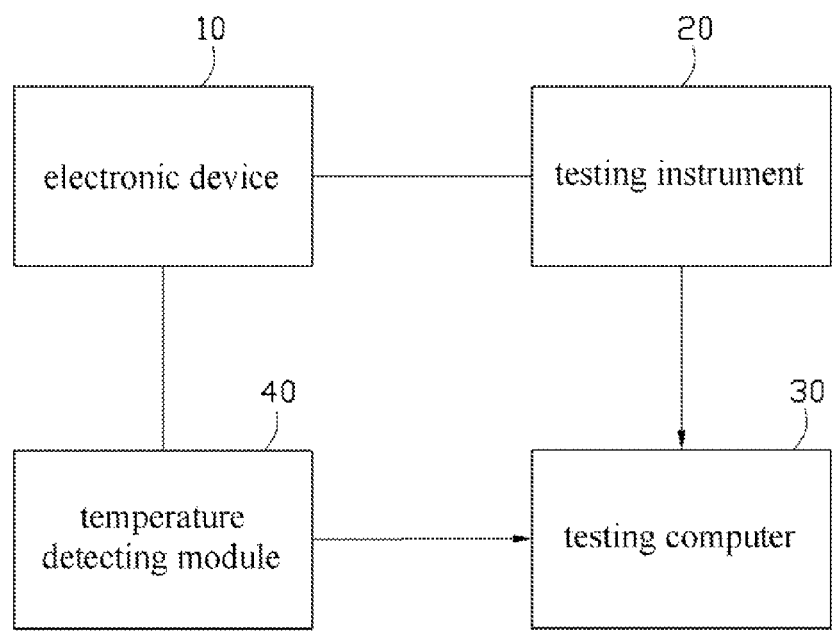
FIG. 1 is a block diagram of an embodiment of a system for testing electronic device, the system comprising an electronic device, a testing instrument, a testing computer, and a temperature detecting module.

FIG. 1 illustrates a system for testing electronic device in accordance with an embodiment. The system includes an electronic device 10, a testing instrument 20 electrically connected to the electronic device 10, a testing computer 30 and a temperature detecting module 40 contacting the electronic device 10. The testing instrument 20 and the temperature detecting module 40 are electrically connected to the testing computer 30. The testing instrument 20 is adapted to test current signals or power signals of the electronic device 10. The temperature detecting module 40 is adapted to detect temperature signals of the electronic device 10. The current signals, the power signals and the temperature signals are transmitted to the testing computer 30 from the testing instrument 20 and the temperature detecting module 40. The testing computer 30 is adapted to analyze the current signals, the power signals and the temperature signals.

Figure 2:
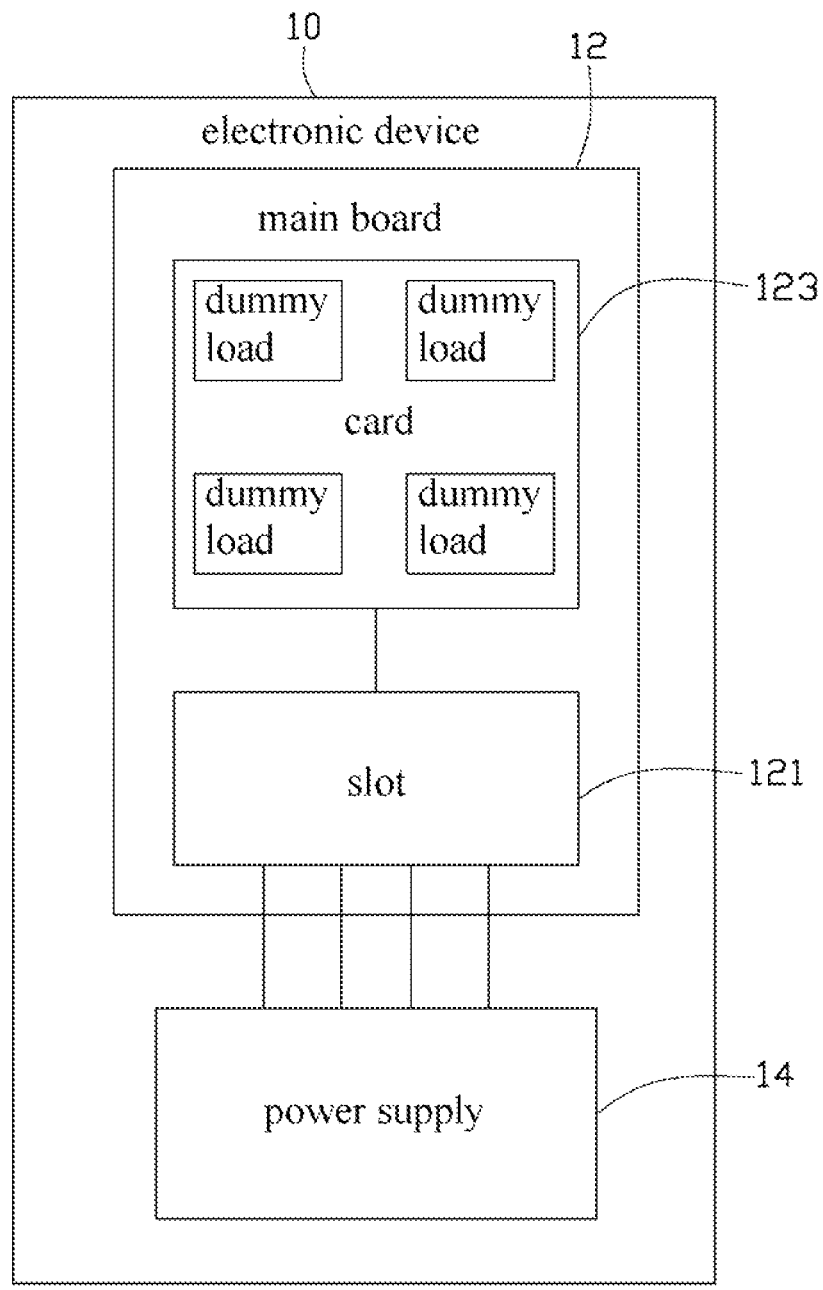
FIG. 2 is an isometric view of the electronic device of FIG. 1.

FIG. 2 illustrates the electronic device 10 in accordance with one embodiment. The electronic device 10 includes a main board 12 and a power supply 14 electrically connected to the main board 12. The main board 12 includes a slot 121 and a card 123 inserted in the slot 121. In one embodiment, the slot 121 is a Peripheral Component Interconnect (PCI) slot or a PCI-Express (PCI-E) slot. The slot 121 includes four voltage interfaces. The power supply 14 includes four power wires which are electrically connected to the four voltage interfaces of the slot 121. The power supply 14 is adapted to output 3.3V, 5V, +12V and −12V voltages to the four power wires respectively. A plurality of dummy loads (not shown) is located on the card 123 to simulate heat dissipation in the electronic device 10. The temperature detecting module 40 includes a plurality of temperature sensors (not shown) which are located on the plurality of dummy loads to detect temperature of the dummy loads. In one embodiment, the plurality of dummy loads is heating resistors.

In one embodiment, the testing instrument 20 is an ampere meter. The testing instrument 20 is adapted to read current values of the four power wires and transmit the current values to the testing computer 30. The voltages output at the four power wires of the power supply 14 are constant values. Power values of the four power wires can be calculated by the testing computer 30 with the following formula: P=UI. The sum of the four power wires power values is a total power value of the card 123 inserted in the slot 121. The testing computer 30 is adapted to calculate the total power value of the card 123 by adding the power values of the four power wires together. In another embodiment, the testing instrument 20 is a power meter. The testing instrument 20 is adapted to read power values of the four power wires directly. The power values of the four power wires are transmitted to the testing computer 30 to calculate the total power value of the card 123.

Figure 3:
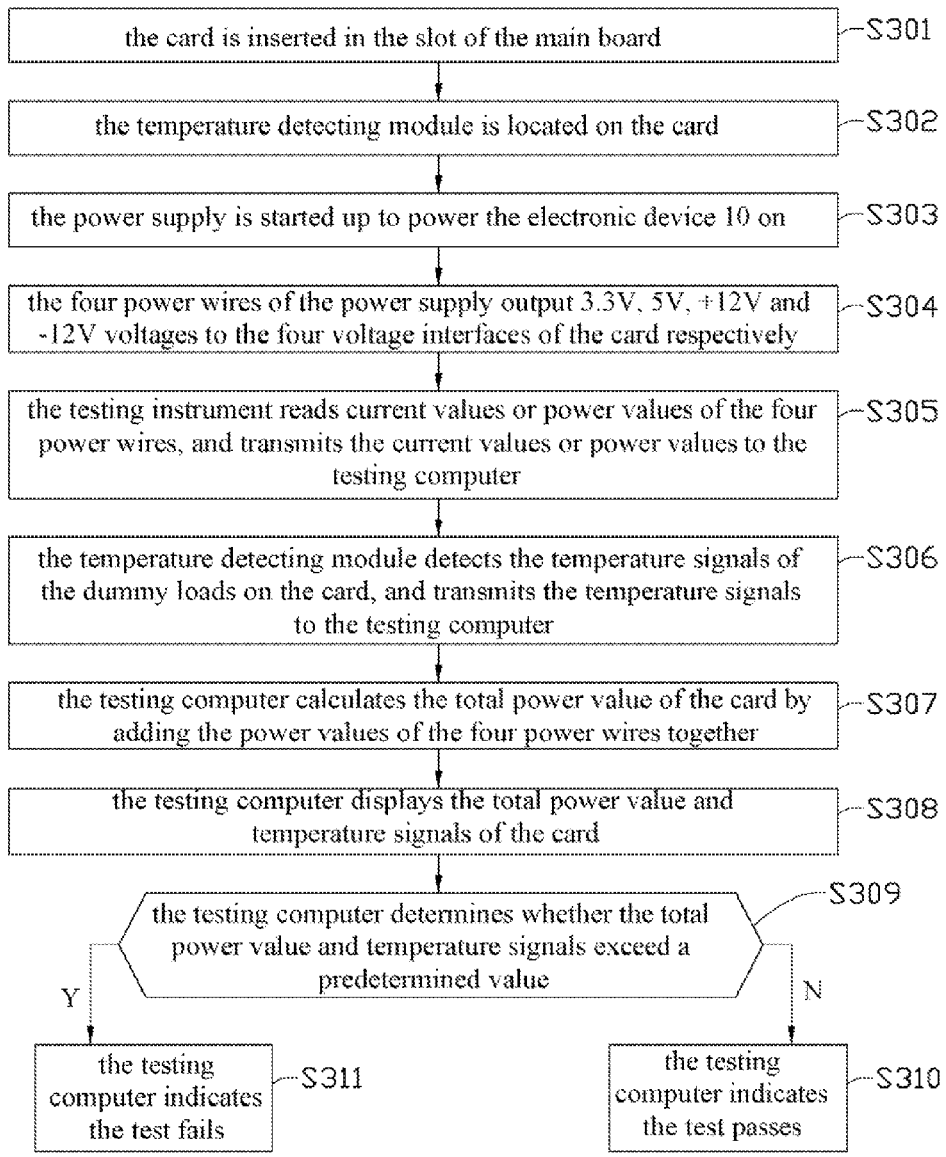
FIG. 3 is a flow chart of an embodiment of a method for testing the electronic device.

FIG. 3, illustrates a flow chart of a method for testing electronic device in accordance with one embodiment. Depending on the embodiment, certain steps described below may be removed, while others may be added, and the sequence of the steps may be altered. In one embodiment, the method for exposing photograph by separated parts in a camera device utilizing the above-described system includes the following steps:

S301: the card 123 is inserted in the slot 121 of the main board 12;

S302: the temperature detecting module 40 is located on the card 123; the temperature detecting module 40 includes at least one temperature sensor which is located between two dummy loads or on a special dummy load on the card 123;

S303: the power supply 14 is started up to power the electronic device 10 on;

S304: the four power wires of the power supply 14 output 3.3V, 5V, +12V and −12V voltages to the four voltage interfaces of the card 123 respectively;

S305: the testing instrument 20 reads current values or power values of the four power wires, and transmits the current values or power values to the testing computer 30;

S306: the temperature detecting module 40 detects the temperature signals of the dummy loads on the card 123, and transmits the temperature signals to the testing computer 30;

S307: the testing computer 30 calculates the total power value of the card 123 by adding the power values of the four power wires together;

S308: the testing computer 30 displays the total power value and temperature signals of the card 123;

S309: the testing computer 30 determines whether the total power value and temperature signals exceed a predetermined value; in one embodiment, an upper temperature should below 65 degrees Celsius when the total power value of the card 123 is 18 W, and the upper temperature should below 70 degrees Celsius when the total power value of the card 123 is 25 W;

S310: the testing computer 30 indicates the test passes when the total power value and temperature signals do not exceed the predetermined value; S311: the testing computer 30 indicates the test fails when the total power value and temperature signals exceed the predetermined value.

Even though numerous characteristics and advantages of the present disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

Depending on the embodiment, certain steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A system for testing electronic device comprising:
an electronic device comprising a main board and a power supply; wherein the main board defines a slot; a card inserted in the slot; a plurality of dummy loads located on the card; the slot comprises at least one voltage interface; the power supply comprises at least one power wire electrically connected to the at least one voltage interface;
a temperature detecting module adapted to detect temperature signals of the plurality of dummy loads;
a testing instrument electrically connected to the at least one power wire to test current signals and power signals of the at least one power wire; and
a testing computer adapted to receive and display the temperature signals, the current signals, and the power signals.

2. The system of claim 1, wherein the testing instrument is an ampere meter or a power meter.

3. The system of claim 1, wherein the slot is a Peripheral Component Interconnect (PCI) slot or a PCI-Express (PCI-E) slot, and the slot comprises four voltage interfaces.

4. The system of claim 3, wherein the power supply comprises four power wires, which are electrically connected to the four voltage interfaces of the slot respectively; and the power supply is adapted to output 3.3V, 5V, +12V and −12V voltages to the four power wires respectively.

5. The system of claim 1, wherein the temperature detecting module comprises at least one temperature sensor, which is located on a special dummy load or between two dummy loads.

6. The system of claim 1, wherein the plurality of dummy loads are heating resistors.

7. A method for testing electronic device comprising:
connecting a plurality of power wires of a power supply to a slot on a main board;
inserting a card in the slot; wherein a plurality of dummy loads are located on the card;
locating at least one temperature sensor on the card;
starting up the power supply to output a plurality of voltage signals at the plurality of power wires;
reading current values or power values of the plurality of power wires;
calculating a total power value of the card by adding the power values of the plurality of power wires together;
detecting temperature signals of the plurality of dummy loads by the at least one temperature sensor; and
determining whether the total power value and temperature signals of the card exceed a predetermined value.

8. The method of claim 7, wherein the power values of the plurality of power wires is calculated by multiplying values of the plurality of voltage signals and the corresponding current values.

9. The method of claim 8, wherein current signals, the power signals and the temperature signals are transmitted to a testing computer; and the testing computer is adapted to determine whether the total power value and temperature signals of the card exceed the predetermined value.

10. The method of claim 9, wherein the testing computer is adapted to indicate the test passes when the total power value and temperature signals do not exceed the predetermined value; and the testing computer is adapted to indicate the test fails when the total power value and temperature signals exceed the predetermined value.

* * * * *